United States Patent [19]

Nemetz

[11] Patent Number: 5,746,824
[45] Date of Patent: May 5, 1998

[54] METHOD AND APPARATUS FOR PRODUCING A SINGLE CRYSTAL

[75] Inventor: Friedrich Nemetz, Mauerkirchen, Austria

[73] Assignee: Wacker Siltronic Gesellschaft für Halbeitermaterialien AG, Burghausen, Germany

[21] Appl. No.: 872,566

[22] Filed: Jun. 10, 1997

[30] Foreign Application Priority Data

Jul. 17, 1996 [DE] Germany ............... 196 28 851.7

[51] Int. Cl.[6] .................................................. C30B 15/20
[52] U.S. Cl. ........................... 117/13; 117/20; 117/222
[58] Field of Search ................... 117/13, 20, 213, 117/215, 216, 217, 218, 222, 900

[56] References Cited

U.S. PATENT DOCUMENTS 5,363,796  11/1994  Kobayashi et al. ............ 117/31
5,394,829   3/1995  Uesugi et al. ................. 117/217

FOREIGN PATENT DOCUMENTS

405117075 A  5/1993  Japan ................ 117/20
406056571A   3/1994  Japan ................ 117/20

*Primary Examiner*—Felisa Garrett
*Attorney, Agent, or Firm*—Collard & Roe, P.C.

[57] ABSTRACT

An apparatus and a method are provided for producing a silicon single crystal in an inert-gas flushed pulling chamber by pulling the single crystal from a melt by the Czochralski method. The method includes a) providing in the pulling chamber a first inner chamber and a second inner chamber, each of which is delineated by side, top and bottom boundaries; b) passing a first inert gas stream through the top boundary of the first inner chamber into the first inner chamber, which contains a heat shield, which is disposed around the single crystal, and a crucible containing the melt, and c) passing a second inert gas stream through the bottom boundary of the second inner chamber into the second inner chamber, which contains a heating device for heating the crucible, with the proviso that the first inert gas stream and the second inert gas stream are only able to mix, at the earliest, after leaving the inner chambers.

5 Claims, 2 Drawing Sheets

5,746,824

METHOD AND APPARATUS FOR PRODUCING A SINGLE CRYSTAL

BACKGROUND OF THE INVENTION

1. Field of the Invention

The present invention relates to a method for producing a silicon single crystal in an inert-gas flushed pulling chamber by pulling the single crystal from a melt by the Czochralski method. The invention also relates to an apparatus for carrying out the method.

2. The Prior Art

In the production of silicon single crystals by the Czochralski method it is conventional to flush the pulling chamber with inert gas while a single crystal is being pulled from the melt disposed in a crucible. The flushing with inert gas prevents particles from the gas space of the pulling chamber from being able to reach the phase boundary at which the single crystal is growing. There is namely the danger that particles are incorporated into the crystal, give rise to dislocations and bring the single-crystal growth to a standstill. The flushing with inert gas also influences the extent to which oxygen is incorporated into the growing crystal. The inert gas acts as carrier gas which picks up silicon oxide from the melt and transports it out of the pulling chamber. Silicon oxide is produced during the reaction of the molten material with the wall of the quartz crucible conventionally used and to a large extent outgasses from the melt. The silicon oxide remaining in the melt brings about the incorporation of oxygen into the single crystal. Between the amount of silicon oxide picked up by the inert gas and the amount of oxygen which is incorporated into the single crystal, there is a relationship which is utilized to control the incorporation of oxygen into the single crystal.

The removal of the silicon oxide with the aid of the flushing with inert gas, however, entails problems because some of the silicon oxide deposits as solid in the pulling chamber. If the silicon oxide deposits on the heating device which is used to heat the crucible and is conventionally composed of graphite, a layer of silicon carbide soon forms which covers the surface of the heating device. This layer becomes brittle with time and becomes a source of undesirable particles. The same also happens if the insulation which surrounds the heating device reacts with silicon oxide. In this connection, the insulating behavior of the insulation may additionally change to such an extent that it is no longer possible to pull a single crystal because the requirements governing monocrystalline crystal growth in relation to the temperature field in the melt and in the single crystal can no longer be fulfilled. It is therefore absolutely necessary that the apparatus for producing single crystals is regularly shut down and cleaned and that damaged parts of the apparatus are replaced. Such maintenance operations are, however, cumbersome and associated with very high costs.

To extend the operating times between necessary maintenance operations, EP 568,183 B1 proposes passing an inert gas stream through the pulling chamber. This inert gas stream flows in through an inlet opening in a central region of the upper part of the pulling chamber. This inert gas stream flows radially outwards towards outlet openings which are disposed radially outside the inlet opening in the upper part of the pulling chamber.

The limiting of the passing of the inert gas stream to the upper part of the pulling chamber reduces the possibility of controlling the incorporation of oxygen into the single crystal by means of the inert gas stream. On the other hand, this measure does not prevent silicon oxide continuing to be able to reach by diffusion those apparatus parts in the pulling chamber which are disposed around the crucible and underneath the crucible. In addition, no gas convection takes place in the lower part of the pulling chamber, with the result that carbon dust outgassing from the insulation deposits on the insulation and favors gas discharges between insulation and heating device.

SUMMARY OF THE INVENTION

It is an object of the present invention to achieve an extension of the operating times between two necessary maintenance operations without at the same time having to accept disadvantages.

This object is achieved according to the present invention by providing a method for producing a silicon single crystal in an inert-gas flushed pulling chamber by pulling the single crystal from a melt by the Czochralski method, which comprises the steps of:

a) providing in the pulling chamber a first inner chamber and a second inner chamber, said first inner chamber having a side boundary, a top boundary, and a bottom boundary, and said second inner chamber having a side boundary, a top boundary, and a bottom boundary;

b) passing a first inert gas stream through the top boundary of the first inner chamber into the first inner chamber, which contains a heat shield, which is disposed around the single crystal, and a crucible containing the melt, and c) passing a second inert gas stream through the bottom boundary of the second inner chamber into the second inner chamber, which contains a heating device for heating the crucible, with the proviso that the first inert gas stream and the second inert gas stream are only able to mix, at the earliest, after leaving the inner chambers.

The success of the method is revealed, in particular, in a significant extension of the interval between two necessary maintenance cycles. In addition, large savings are achieved because, for example, the heating device and the surrounding insulation are subject to less wear and have to be replaced less often. A further cost advantage is to be perceived in the fact that the productivity of the pulling system is increased and the single crystals produced have a constantly high quality.

The invention also relates to an apparatus for carrying out the method. The apparatus has a first inner chamber, which contains the crucible and the heat shield, and a second inner chamber, which contains the heating device, and said first inner chamber having a side boundary, a top boundary, and a bottom boundary, and said second inner chamber having a side boundary, a top boundary, and a bottom boundary; and which has a first device for feeding inert gas through the top boundary of the first inner chamber into the first inner chamber and a second device for feeding inert gas through the bottom boundary of the second inner chamber into the second inner chamber.

BRIEF DESCRIPTION OF THE DRAWINGS

Other objects and features of the present invention will become apparent from the following detailed description considered in connection with the accompanying drawing which discloses two embodiments of the present invention. It should be understood, however, that the drawing is designed for the purpose of illustration only and not as a definition of the limits of the invention.

In the drawing, wherein similar reference characters denote similar elements throughout the two views.

In both figures only those features are shown which are necessary to explain the invention.

DETAILED DESCRIPTION OF PREFERRED EMBODIMENTS

Figure 1:
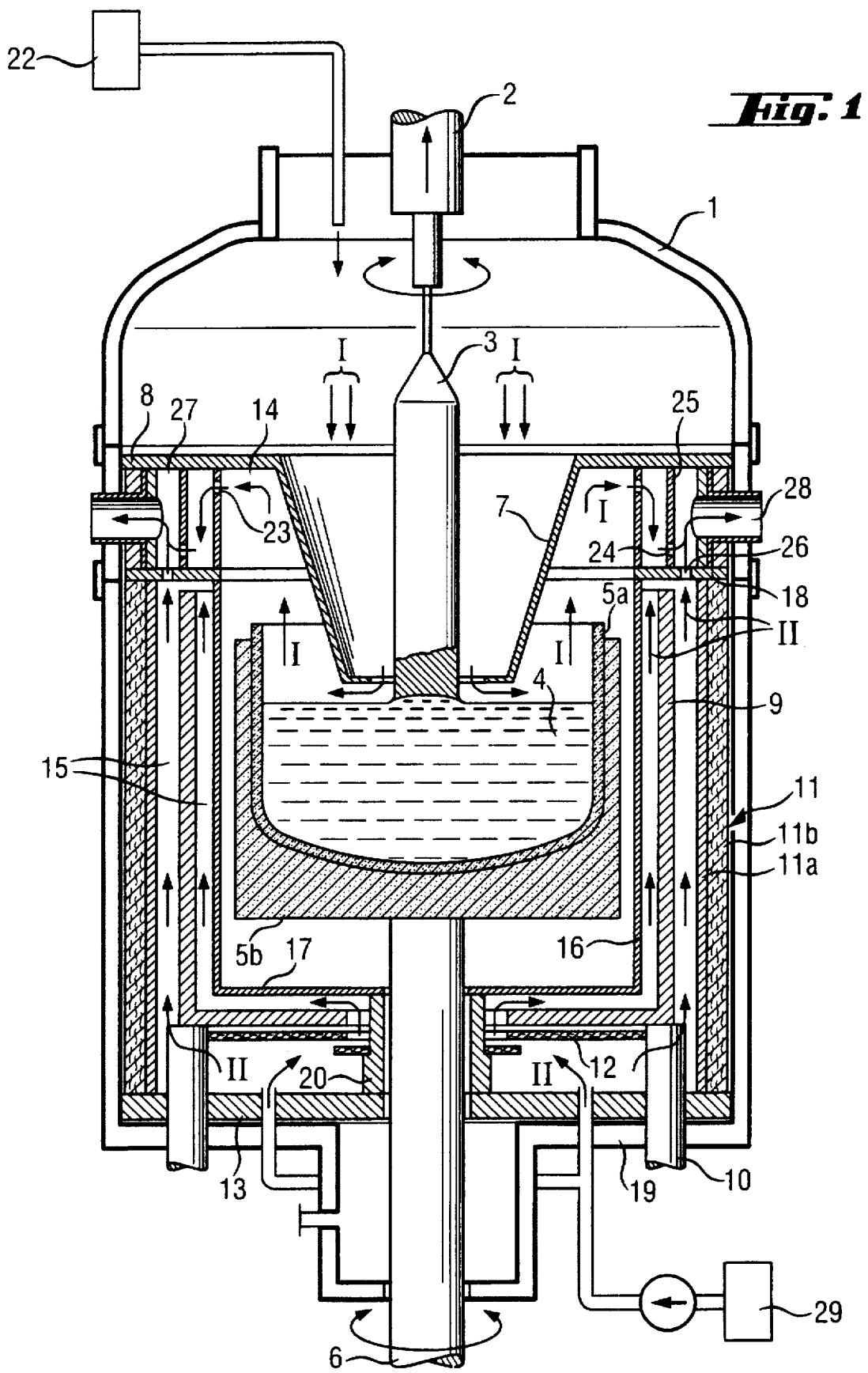
FIG. 1 shows, in a diagrammatic sectional view, an embodiment of the apparatus of the invention.

Turning now in detail to the drawings, the apparatus according to FIG. 1 comprises a pulling chamber 1 having a device 2, only shown schematically, for pulling a single crystal 3 from a melt 4 by the Czochralski method. The melt is contained in a crucible 5a which is conventionally composed of quartz glass, is supported on a supporting crucible 5b and is mounted rotatably and vertically displaceably on a shaft 6. To screen the single crystal thermally, it is conventional to provide a heat shield 7 which surrounds the single crystal and extends to the vicinity of the surface of the melt. The heat shield may be of tubular design or, as can be seen from FIG. 1, of conical design.

To support the heat shield, a holder 8 is provided in the upper part of the pulling system. Disposed around the crucible 5a and below the crucible is a heating device 9. A graphite resistance heater having at least one current supply lead 10 is generally used as heating device. The heating chamber is protected against damaging heat exposure by insulations. One insulation 11 is disposed around the heating device. It comprises, for example, a graphite radiation tube 11a and a graphite-felt winding 11b. Further insulations 12 and 13 are contained in the lower part of the pulling chamber 1.

In the embodiment shown, the interior of the pulling chamber below the holder 8 for the heat shield 7 is subdivided into inner chambers by further internal walls. There is a first inner chamber 14, in which the heat shield 7 and the crucible 5a are contained and a second inner chamber 15, in which the heating device 9 is contained. The first inner chamber 14 is delineated laterally by a tube 16. Further boundaries are formed by the holder 8 (top boundary of the chamber 14) and a carrier plate 17 (bottom boundary of the chamber 14). The tube 16 and the carrier plate 17 are preferably made of graphite and simultaneously also act as boundaries of the second inner chamber 15. Further boundaries of the second inner chamber 15 are formed by the cover 18 (top boundary of the chamber 15), the insulation 13 (bottom boundary of the chamber 15) and also a supporting tube 20 and the insulation 11 (lateral boundaries of the chamber 15).

Each of the inner chambers 14 and 15 has its own device for feeding in inert gas. The device 22 for feeding inert gas into the first inner chamber 14 passes an inert gas stream I into the upper part of the pulling chamber and through the holder 8 and through the heat shield 7 into the first inner chamber 14. The inert gas stream fed in leaves the inner chamber 14 through outlet openings 23 in the tube 16 and through outlet openings 24 in a deflection tube 25. Finally, the inert gas fed in is vacuumed out of the pulling chamber 1 through extraction openings 28. The device 29 for feeding inert gas into the second inner chamber 15 passes an inert gas stream II through the bottom 19 of the pulling chamber 1 and the insulation 13 into the second inner chamber 15. The inert gas stream fed in leaves the inner chamber 15 through outlet openings 26 in the cover 18 and is also vacuumed out of the pulling chamber 1 through the extraction openings 28.

The inert gas streams are able to mix at the earliest after leaving the inner chambers 14 and 15. In the embodiment shown in FIGS. 1 and 2, this takes place in an extraction chamber 27 which is connected to the extraction openings 28. The construction of this apparatus of the invention prevents the inert gas stream I, which entrains and is loaded with silicon oxide, from being able to reach, in particular, the heating device 9 and the insulation 11. On the other hand, the inert gas stream II prevents deposits from forming on the insulation 11 and consequently prevents an increased risk of electrical flashovers.

Figure 2:
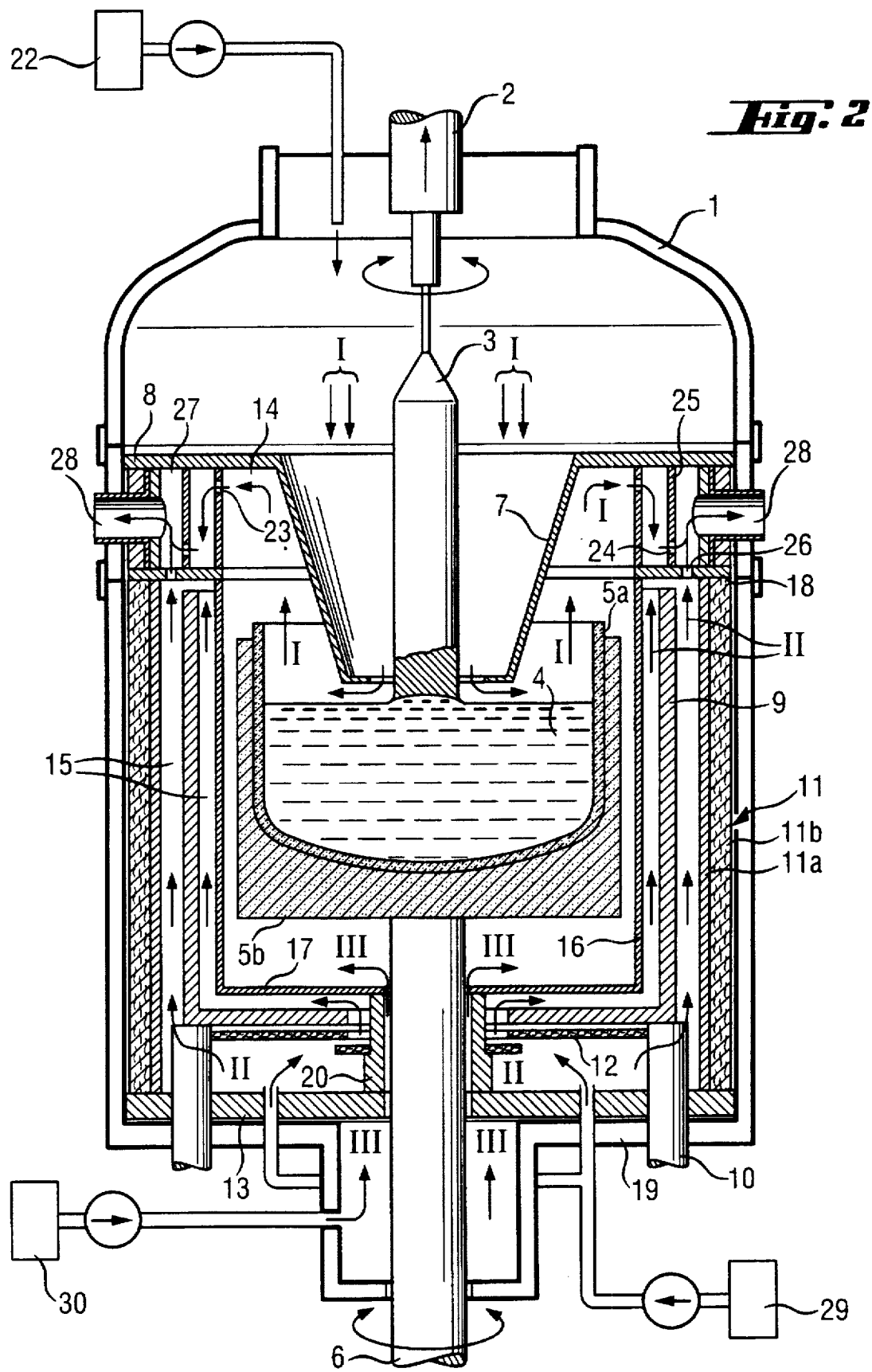
FIG. 2 shows, also in a sectional view, a further embodiment of the apparatus of the invention.

FIG. 2 shows a further embodiment of the invention which differs from the embodiment illustrated in FIG. 1 by an additional feature. The apparatus of FIG. 2 has a third device 30 for feeding in inert gas, which device passes an inert gas stream III through the carrier plate 17 into the first inner chamber 14. The inert gas stream III fed in leaves the inner chamber 14 through the outlet openings 23 in the tube 16 and also through the outlet openings 24 in the deflection tube 25 and is vacuumed out of the pulling chamber 1 through the extraction openings 28. The inert gas streams I and III are readily mixed in the inner chamber 14.

In this embodiment of FIG. 2, the incorporation of oxygen into the single crystal is influenced and controlled not only by the feeding-in of the inert gas stream I, but also by the feeding-in of the inert gas stream III. An important variable by means of which the incorporation of oxygen can be controlled is the amount of inert gas which is passed through the inner chamber 14 per unit time by means of the inert gas streams I and III. The amount of inert gas has to be charged in a controlled manner during the pulling of the single crystal so that a certain oxygen concentration is achieved in the single crystal. The oxygen concentration in the single crystal should generally not exceed or not be below a desired, narrow value range.

So that the desired oxygen concentration is actually achieved in the single crystal, preliminary experiments are carried out to determine the ratio in which the inert gas streams I and III have to feed inert gas into the inner chamber and to clarify how the ratio has to change during the growth of the single crystal. If the third inert gas stream III is dispensed with, that amount of inert gas is decisive which gets into the inner chamber 14 per unit time as a result of the inert gas stream I and the change in this amount with time.

EXAMPLE

The comparison of the operating times between necessary maintenance operations due to wear of the heating device or the insulation surrounding it revealed that an apparatus according to FIG. 1 could be operated approximately five times as long under comparable pulling conditions as a similar apparatus of known design.

While several embodiments of the present invention have been shown and described, it is to be understood that many changes and modifications may be made thereunto without departing from the spirit and scope of the invention as defined in the appended claims.

What is claimed is:

1. A method for producing a silicon single crystal in an inert-gas flushed pulling chamber by pulling the single crystal from a melt by the Czochralski method, which comprises the steps of a) providing in the pulling chamber a first inner chamber and a second inner chamber, said first inner chamber having a side boundary, a top boundary, and a bottom boundary, and said second inner chamber having a side boundary, a top boundary, and a bottom boundary;

b) passing a first inert gas stream through the top boundary of the first inner chamber into the first inner chamber, which contains a heat shield, which is disposed around the single crystal, and a crucible containing the melt, and c) passing a second inert gas stream through the bottom boundary of the second inner chamber into the second inner chamber, which contains a heating device for heating the crucible, with the proviso that the first inert gas stream and the second inert gas stream are only able to mix, at the earliest, after leaving the first inner chamber and the second inner chamber.

2. The method as claimed in claim 1, comprising passing a third inert gas stream through the bottom boundary of the first inner chamber into the first inner chamber.

3. The method as claimed in claim 2, comprising feeding-in of the first inert gas stream and feeding-in the third inert gas stream for controlling the incorporation of oxygen into the single crystal.

4. An apparatus for producing a silicon single crystal by the Czochralski method, comprising an inert-gas flushed pulling chamber containing a device for pulling the single crystal from a melt and having:

a) a crucible for receiving the melt;

b) a heating device for heating the crucible which is disposed around the crucible;

c) an insulation which is disposed around the heating device;

d) a heat shield which is disposed above the melt around the single crystal;

e) a first inner chamber, which contains the crucible and the heat shield, and a second inner chamber, which contains the heating device, said first inner chamber having a side boundary, a top boundary, and a bottom boundary; said second inner chamber having a side boundary, a top boundary, and a bottom boundary; and f) a first means for feeding inert gas through the top boundary of the first inner chamber into the first inner chamber and a second means for feeding inert gas through the bottom boundary of the second inner chamber into the second inner chamber.

5. The apparatus as claimed in claim 4, comprising a third means for feeding inert gas through the bottom boundary of the first inner chamber into the first inner chamber.

* * * * *